(12) United States Patent
Lee

(10) Patent No.: US 7,838,413 B2
(45) Date of Patent: Nov. 23, 2010

(54) METHOD OF MANUFACTURING PHASE-CHANGE MEMORY ELEMENT

(75) Inventor: Kun Hyuk Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 337 days.

(21) Appl. No.: 11/646,090

(22) Filed: Dec. 26, 2006

(65) Prior Publication Data

US 2007/0148869 A1    Jun. 28, 2007

(30) Foreign Application Priority Data

Dec. 28, 2005    (KR) .................... 10-2005-0131352

(51) Int. Cl.
*H01L 47/00*    (2006.01)
*H01L 29/02*    (2006.01)

(52) U.S. Cl. .................... 438/622; 257/4; 365/597; 365/148; 438/257

(58) Field of Classification Search .............. 257/3, 257/5, 7, 295, E31.029; 438/257, 102, 466, 438/382, 653, 697; 356/148
See application file for complete search history.

(56) References Cited

U.S. PATENT DOCUMENTS

| | | | | |
|---|---|---|---|---|
| 6,001,730 A * | 12/1999 | Farkas et al. | ................ | 438/627 |
| 6,709,316 B1 * | 3/2004 | Sun et al. | ................ | 451/41 |
| 7,115,504 B2 * | 10/2006 | Moore et al. | ................ | 438/660 |
| 7,115,927 B2 * | 10/2006 | Hideki et al. | ................ | 257/296 |
| 7,214,958 B2 * | 5/2007 | Happ | ................ | 257/4 |
| 7,259,040 B2 * | 8/2007 | Pellizer et al. | ................ | 438/102 |
| 7,323,708 B2 * | 1/2008 | Lee et al. | ................ | 257/3 |
| 2003/0193063 A1 * | 10/2003 | Chiang et al. | ................ | 257/295 |
| 2003/0203512 A1 * | 10/2003 | Kweon | ................ | 438/3 |
| 2005/0110983 A1 * | 5/2005 | Jeong et al. | ................ | 356/148 |
| 2006/0073631 A1 * | 4/2006 | Karpov et al. | ................ | 438/102 |
| 2006/0113520 A1 * | 6/2006 | Yamamoto et al. | ................ | 257/3 |
| 2007/0029676 A1 * | 2/2007 | Takaura et al. | ................ | 257/758 |
| 2007/0138595 A1 * | 6/2007 | Hsu et al. | ................ | 257/536 |

* cited by examiner

*Primary Examiner*—Steven Loke
*Assistant Examiner*—David Goodwin
(74) *Attorney, Agent, or Firm*—The Law Office of Andrew D. Fortney; Andrew D. Fortney

(57) ABSTRACT

Disclosed is a method of manufacturing a phase-change memory in which the lower electrode of the phase-change memory device is formed using barrier metal for forming a metal interconnection and a via in damascene and dual damascene processes. The method includes the steps of patterning an insulating layer on a semiconductor substrate, sequentially forming barrier metal and metal on the patterned insulating layer, polishing the metal by a CMP process to planarize the metal and patterning the planarized barrier metal to a lower electrode of a desired phase-change memory device, depositing an insulating layer on the patterned lower electrode, forming a hole in the deposited insulating layer, and forming an upper electrode on the resultant material to pattern the upper electrode, and depositing an insulating layer on the upper electrode and forming a via for connecting a metal interconnection and the lower electrode to each other. Therefore, additional deposition for forming the lower electrode is not necessary. Also, copper (Cu) and copper alloy are used, interconnection resistance is reduced to be stabilized so that it is possible to improve the characteristic of the semiconductor device.

18 Claims, 4 Drawing Sheets

METHOD OF MANUFACTURING PHASE-CHANGE MEMORY ELEMENT

This application claims the benefit of Korean Application No. 10-2005-0131352, filed on Dec. 28, 2005, which is incorporated by reference herein in its entirety.

BACKGROUND OF THE INVENTION

1. Field of the Invention

The present invention relates to a method of manufacturing a phase change memory element. More specifically, the present invention relates to a method of manufacturing a lower electrode of a phase-change memory element using a metal interconnection and a barrier metal for forming a via.

2. Description of the Related Art

As generally known in the art, a phase-change memory element signifies a memory element in which information is stored using a difference in electrical conductivity between the crystalline phase and the amorphous phase of a specific material. In the phase change memory device, a transistor element or a diode element for addressing and reading/writing operations is provided on a semiconductor substrate and a phase-change region is electrically connected to such elements. Since information is stored using a difference in conductivity in accordance with a phase-change, data are actually stored in the phase-change memory element including the phase-change region.

The operation of the phase-change memory device will be described below. Current that flows through a transistor or a diode electrically heats the phase-change region. Therefore, the structure of the phase-change material is reversibly converted into the crystalline phase and the amorphous phase so that information is stored. Relatively low current flows to the phase-change region to measure the resistance of the phase-change material and to read the stored information.

The schematic structure of the above-mentioned phase-change memory device is illustrated in FIG. 1.

That is, referring to FIG. 1, a metal nitride layer used as a lower electrode 103 is deposited on a via 101 connected to the lower electrode and desired patterning is performed on the deposited metal nitride layer.

Then, an insulating layer 105 is deposited on the patterned lower electrode 103 and a hole is formed to connect the deposited insulating layer 105 to the lower electrode 103.

Then, a phase-change material 107 such as chalcogenide and an upper electrode 109 are sequentially deposited on an insulating layer 105 where the hole is formed. Then, an insulating layer 111 is deposited on the deposited upper electrode 109 and the hole for connecting the deposited insulating layer 111 to the upper electrode 109 is formed.

Finally, a metal interconnection 113 is deposited on the insulating layer 111 where the hole is formed to complete the phase-change memory device.

However, processes of completing the phase-change memory are very complicated. In particular, the metal nitride layer must be necessarily deposited in order to deposit the lower electrode. In consideration of the rapidly developed semiconductor process, that is, damascene and dual damascene processes, in the processes, the lower electrode can be formed the same as the conventional technology using barrier metal deposited before depositing and plating metal for forming the metal inter connection and the via. Therefore, an additional thin layer depositing process for forming a lower electrode is unnecessary so that it is necessary to develop a new process.

SUMMARY OF THE INVENTION

The present invention has been made to solve the above problem occurring in the prior art, and therefore, it is an object of the present invention to provide a method of manufacturing a phase-change memory in which the lower electrode of the phase-change memory device is formed using barrier metal for forming a metal interconnection and a via in damascene and dual damascene processes.

According to one aspect of the present invention, there is provided a method of manufacturing a phase-change memory device in a semiconductor device. The method comprising the steps of patterning an insulating layer on a semiconductor substrate, sequentially forming barrier metal and metal on the patterned insulating layer, polishing the metal by a CMP process to planarize the metal and patterning the planarized barrier metal to a lower electrode of a desired phase-change memory device, depositing an insulating layer on the patterned lower electrode, forming a hole in the deposited insulating layer, and forming an upper electrode on the resultant material to pattern the upper electrode, and depositing an insulating layer on the upper electrode and forming a via for connecting a metal interconnection and the lower electrode to each other.

DETAILED DESCRIPTION OF THE INVENTION

Figure 1:
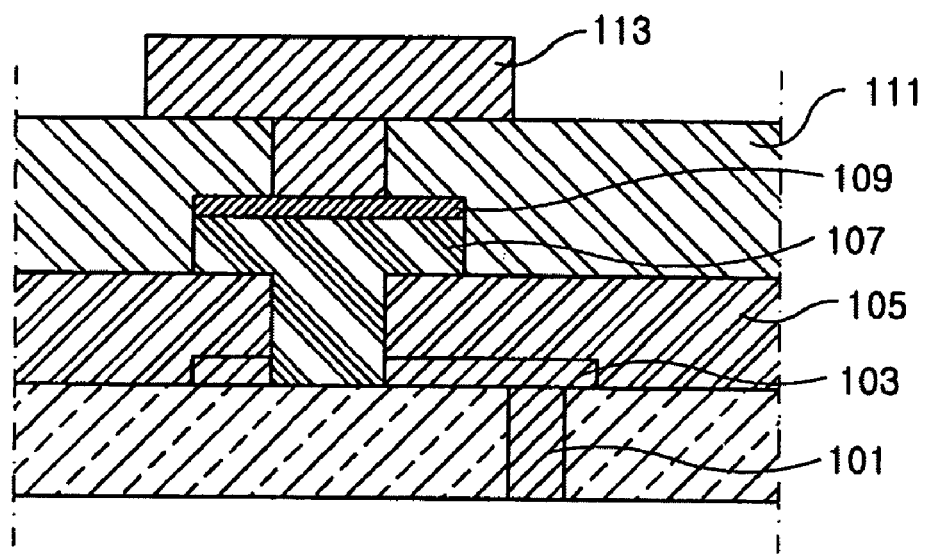
FIG. 1 is a sectional view schematically illustrating a conventional phase-change memory device.

Hereinafter, preferred embodiments of the present invention will be described in detail with reference to the attached drawings. Those who skilled in the art will understand the object, characteristic, and advantages of the present invention through these embodiments.

According to the present invention, an insulating layer 201 is deposited on a semiconductor substrate, a photoresist (PR) (not shown) pattern is formed, and the insulating layer 201 is patterned using the PR pattern as a mask in order to form a metal interconnection or a via. Then, a barrier metal 203 is deposited on the patterned insulating layer 201 and a metal 205 is formed on the deposited barrier metal 203 to make an interconnection.

Then, the metal 205 formed on the barrier metal 203 is polished to be planarized by a chemical mechanical polishing (CMP) process. Then, the planarized barrier metal 203 is patterned to the lower electrode through a photolithography process and an etching process.

Finally, an insulating layer 207 is deposited on the lower electrode, a hole is formed in the insulating layer 207 so that the lower electrode and a phase-change material 209 can be connected to each other, an upper electrode 211 formed of the phase-change material 209 and a metal nitride material is formed and patterned, an insulating layer 213 is deposited on the upper electrode 211, and a via 215 is formed in order to connect an upper metal interconnection 217 to the lower electrode. It is possible to easily achieve the object of the present invention through the technical operation.

FIGS. 2A to 2F are sectional views illustrating processes of a method of manufacturing a phase-change memory device according to the present invention.

Figure 2A:
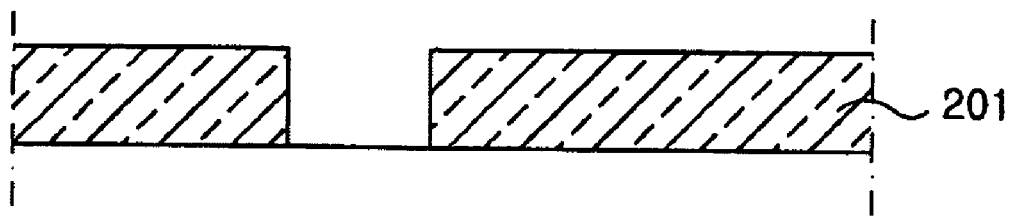
FIGS. 2A to 2F are sectional views illustrating processes of a method of manufacturing a phase-change memory device according to the present invention.

First, as illustrated in FIG. 2A, an insulating layer 201 is deposited on a semiconductor substrate, a PR pattern (not shown) is formed, the insulating layer 201 is patterned using the PR pattern as a mask in order to form a metal interconnection or a via.

Figure 2B:
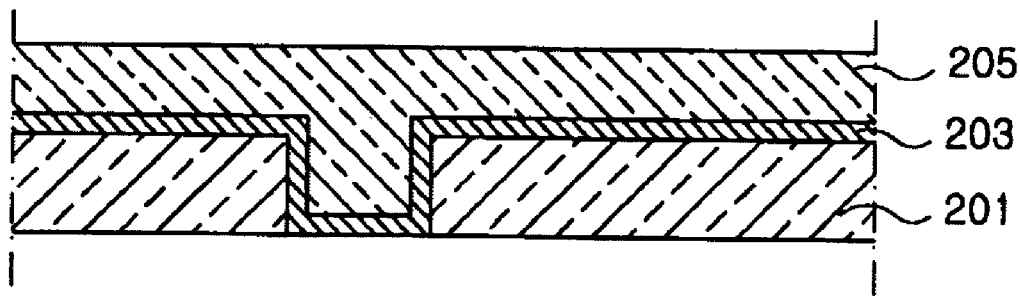

Then, as illustrated in FIG. 2B, a barrier metal 203 formed of metal such as Ti and Ta and a metal nitride such as TiN and TaN is deposited on the patterned insulating layer 201, and a metal 205 for interconnection is formed on the deposited barrier metal 203. Here, the metal 205 can be formed of one of copper (Cu), aluminum (Al), and tungsten (W).

Figure 2C:
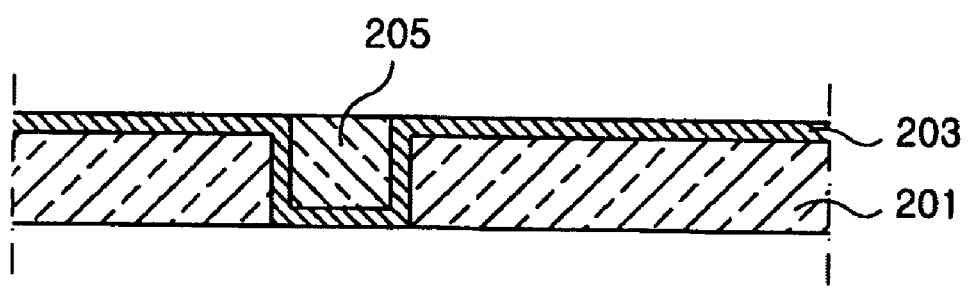

Then, as illustrated in FIG. 2C, the metal 205 formed on the barrier metal 203 is polished by a CMP process to be planarized while the barrier metal 203 on the insulating layer 201 is remained.

Figure 2D:
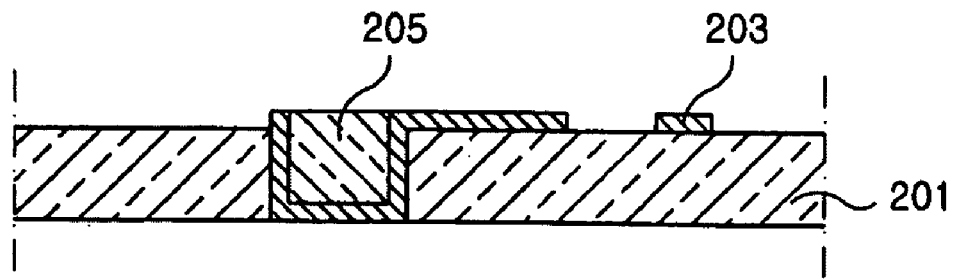

Then, as illustrated in FIG. 2D, the planarized barrier metal 203 is patterned to the lower electrode of a desired phase-change memory device through a photolithography process and an etching process (since they are well-known technologies, detailed description will be omitted).

Figure 2E:
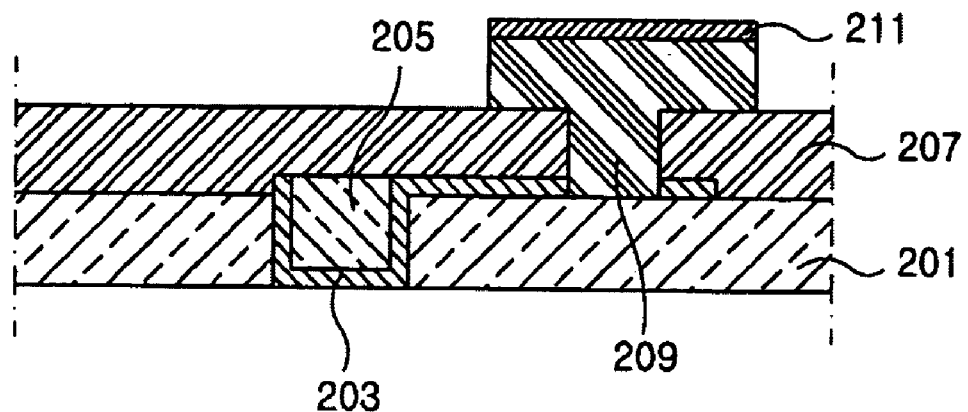

Then, as illustrated in FIG. 2E, an insulating layer 207 is deposited on the patterned lower electrode, a hole is formed in the insulating layer 207 so that the lower electrode and a phase change material 209 can be connected to each other, and an upper electrode 211 formed of the phase-change material 209 and the metal nitride material is formed to be patterned. The phase-change material 209 may comprise a chalcogenide phase-change material, such as a selenide and/or telluride of a metal and/or metalloid having an amorphous phase and an at least partially crystalline phase, where the different phases have at least one different electrical property (such as resistivity) and the phase-change material may undergo a reversible phase change above a predetermined temperature and/or when a predetermined electric field is applied thereto, such as germanium antimony (or stibium) telluride (GeSbTe). Other such phase-change materials may include arsenic telluride, arsenic selenide, antimony telluride, antimony selenide, bismuth telluride, bismuth selenide, germanium telluride, germanium selenide, lead selenide, lead telluride, combinations thereof (such as mixed tellurides and selenides of the same metal or metalloid), etc.

Figure 2F:
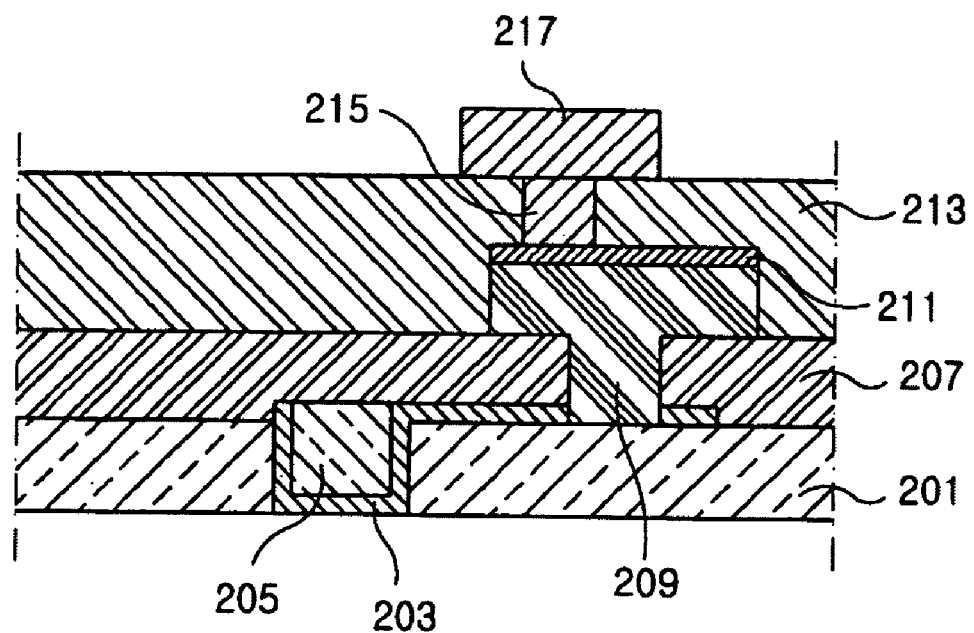

Finally, as illustrated in FIG. 2F, an insulating layer 213 is deposited on the upper electrode 211 and a via 215 is formed in order to connect the metal interconnection 217 to the lower electrode.

Therefore, the lower electrode of the phase-change memory device is manufactured using the barrier metal for forming the metal interconnection and the via by the damascene and dual damascene processes so that additional deposition for forming the lower electrode is not necessary. Also, copper (Cu) and copper alloy are used, interconnection resistance is reduced to be stabilized so that it is possible to improve the characteristic of the semiconductor device.

While the invention has been shown and described with reference to certain preferred embodiments thereof, it will be understood by those skilled in the art that various changes in form and details may be made therein without departing from the spirit and scope of the invention as defined by the appended claims.

As described above, according to the present invention, the lower electrode of the phase-change memory device is manufactured using the barrier metal for forming the metal interconnection and the via by the damascene and dual damascene processes so that additional deposition for forming the lower electrode is not necessary. Also, copper (Cu) and copper alloy are used, interconnection resistance is reduced to be stabilized so that it is possible to improve the characteristic of the semiconductor device.

What is claimed is:

1. A method of manufacturing a phase-change memory device, comprising:

patterning a first insulating layer on a semiconductor substrate;

sequentially forming a barrier metal and a lower electrode metal on the patterned first insulating layer;

planarizing the lower electrode metal by chemical mechanical polishing (CMP) to expose the barrier metal on an uppermost surface of the patterned first insulating layer, and patterning the barrier metal by photolithography and etching to form a lower electrode of the phase-change memory device, wherein the patterned barrier metal includes a first portion surrounding a remaining portion of the lower electrode metal except for an upper surface of the lower electrode metal and a second portion on the insulating layer;

after patterning the barrier metal, depositing a second insulating layer on the lower electrode and forming a hole in the deposited second insulating layer over the barrier metal on an uppermost surface of the patterned first insulating layer;

depositing a phase-change material in the hole contacting the second portion of the patterned barrier metal and on the second insulating layer to a predetermined thickness;

depositing an upper electrode material on the phase-change material;

patterning the upper electrode material and the phase-change material to a predetermined width wider than the hole;

depositing a third insulating layer on the upper electrode and forming a via therein exposing the upper electrode, such that the via overlaps a same vertical plane as the hole in the second insulating layer; and forming a contact plug in the via in contact with the upper electrode and forming a metal interconnection on the third insulating layer, connected to the lower electrode through the phase change material.

2. The method of claim 1, wherein the barrier metal includes a metal nitride.

3. The method of claim 2, wherein the metal nitride comprises TiN or TaN.

4. The method of claim 1, further comprising depositing an adhesive metal on the first insulating layer, prior to forming the barrier metal.

5. The method of claim 4, wherein the adhesive metal comprises Ti or Ta.

6. The method of claim 1, wherein the lower electrode metal formed on the barrier metal is selected from the group consisting of copper (Cu), aluminum (Al), and tungsten (W).

7. The method of claim 1, wherein the phase-change material comprises a selenide or telluride of a metal or metalloid.

8. A method of manufacturing a phase-change memory device, comprising:

forming a barrier metal on a patterned first insulating layer on a semiconductor substrate, and forming a lower electrode metal on the barrier metal, polishing the lower electrode metal and the barrier metal by chemical mechanical polishing (CMP) and patterning the barrier metal on an uppermost surface of the patterned first insulating layer by photolithography and etching to form a lower electrode of the phase-change memory device;

wherein the barrier metal includes a first portion surrounding a remaining portion of the lower electrode metal except for an upper surface of the lower electrode metal and a second portion on the first insulating layer;

after patterning the barrier metal, depositing a second insulating layer on the lower electrode metal and forming a hole in the deposited second insulating layer over the patterned barrier metal;

depositing a phase-change material in the hole contacting the second portion of the patterned barrier metal and on the second insulating layer to a predetermined thickness on the second insulating layer;

depositing an upper electrode material on the phase-change material, and patterning the upper electrode material and the phase-change material to form a phase-change memory element and an upper electrode having a predetermined width wider than the hole;

depositing a third insulating layer on the upper electrode and forming a via therein exposing the upper electrode material, such that the via overlaps a same vertical plane as the hole in the second insulating layer;

forming a contact plug in the via in contact with the upper electrode; and forming a metal interconnection on the third insulating layer in contact with the contact plug.

9. The method of claim 8, wherein the barrier metal comprises TiN or TaN.

10. The method of claim 9, further comprising depositing an adhesive metal comprising Ti or Ta on the first insulating layer, prior to forming the barrier metal.

11. The method of claim 8, further comprising depositing an adhesive metal comprising Ti or Ta on the first insulating layer, prior to forming the barrier metal.

12. The method of claim 8, wherein the metal formed on the barrier metal is selected from the group consisting of copper (Cu), aluminum (Al), and tungsten (W).

13. The method of claim 8, further comprising patterning the first insulating layer to form a trench or first via, and depositing the barrier metal and the lower electrode metal in the trench or first via.

14. The method of claim 8, wherein the phase-change material comprises a selenide or telluride of a metal or metalloid.

15. The method of claim 3, wherein the metal nitride comprises TiN.

16. The method of claim 6, wherein the lower electrode metal formed on the barrier metal comprises tungsten.

17. The method of claim 9, wherein the barrier metal comprises TiN, and the metal formed on the barrier metal comprises tungsten.

18. The method of claim 1, wherein the lower electrode metal and the upper electrode are not in the same vertical plane.

* * * * *